（12）United States Patent
Suda (10) Patent No.:     US 6,208,161 B1
(45) Date of Patent:     Mar. 27, 2001

(54) DIFFERENTIAL SIGNAL TRANSMISSION CIRCUIT

(75) Inventor: Masakatsu Suda, Kitamoto (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/221,498

(22) Filed: Dec. 28, 1998

(30) Foreign Application Priority Data

Jan. 9, 1998 (JP) .................................................. 10-002732

(51) Int. Cl.$^7$ ...................................................... H03K 17/16
(52) U.S. Cl. .................................................. 326/30; 326/86
(58) Field of Search .................................. 326/30, 86, 90, 326/82; 333/22 R (56) References Cited

U.S. PATENT DOCUMENTS 5,898,326 * 4/1999 Okayasu ................................ 327/112
5,955,889 * 9/1999 Taguchi et al. ......................... 326/30

* cited by examiner

*Primary Examiner*—Michael Tokar
*Assistant Examiner*—Anh Tran
(74) *Attorney, Agent, or Firm*—Muramatsu & Associates (57) ABSTRACT

A differential signal transmission circuit for transmitting a high speed pulse signal through relatively long transmission cables. The differential signal transmission circuit includes a CMOS differential driver for receiving a high speed signal to be transmitted from an LSI circuit and providing the signal to a differential transmission cable, an impedance matching circuit connected between an output of the CMOS differential driver and ground to substantially decrease an output impedance of the driver, and a series termination circuit provided between the output of the CMOS differential driver and the differential transmission cable to match a sum of resistance of the series transmission circuit and an overall impedance at the output of the driver with a characteristic impedance of the differential transmission cable.

11 Claims, 7 Drawing Sheets

DIFFERENTIAL SIGNAL TRANSMISSION CIRCUIT

FIELD OF THE INVENTION

This invention relates to a differential signal transmission circuit for transmitting a high speed pulse signal through a differential transmission line, and more particularly, to a differential signal transmission circuit to be used in a semiconductor test system in which a differential type CMOS circuit directly drives a differential transmission line formed of a pair of coaxial cables or twisted pair lines.

BACKGROUND OF THE INVENTION

In testing high speed electrical devices such as LSI and VLSI circuits, a semiconductor test system must have high speed signal transmission circuits for sending high speed test signals from a main frame to a test head or receiving response signals of a device under test (DUT) sent from the test head to the main frame. In many situations, such signal transmission is performed in a differential mode in which two signals, each being applied between an input terminal and a common ground, i.e., balanced with one another, are amplified and transmitted.

Figure 5:
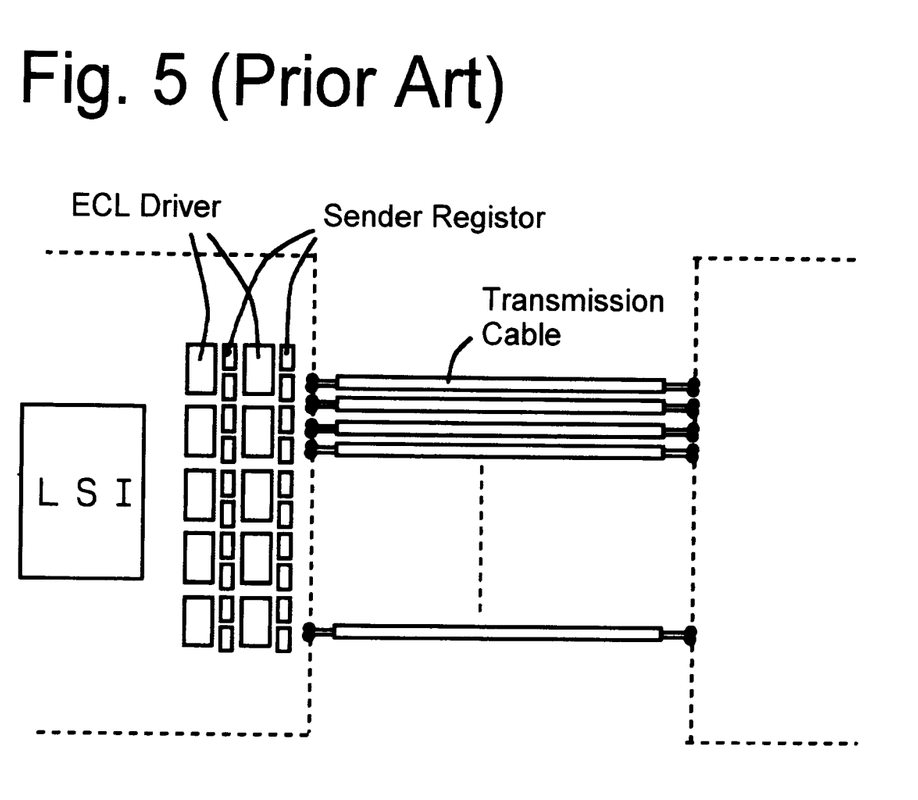
FIG. 5 is a schematic diagram showing a physical layout in the differential signal transmission circuit in the conventional technology of FIG. 6.
Figure 6:
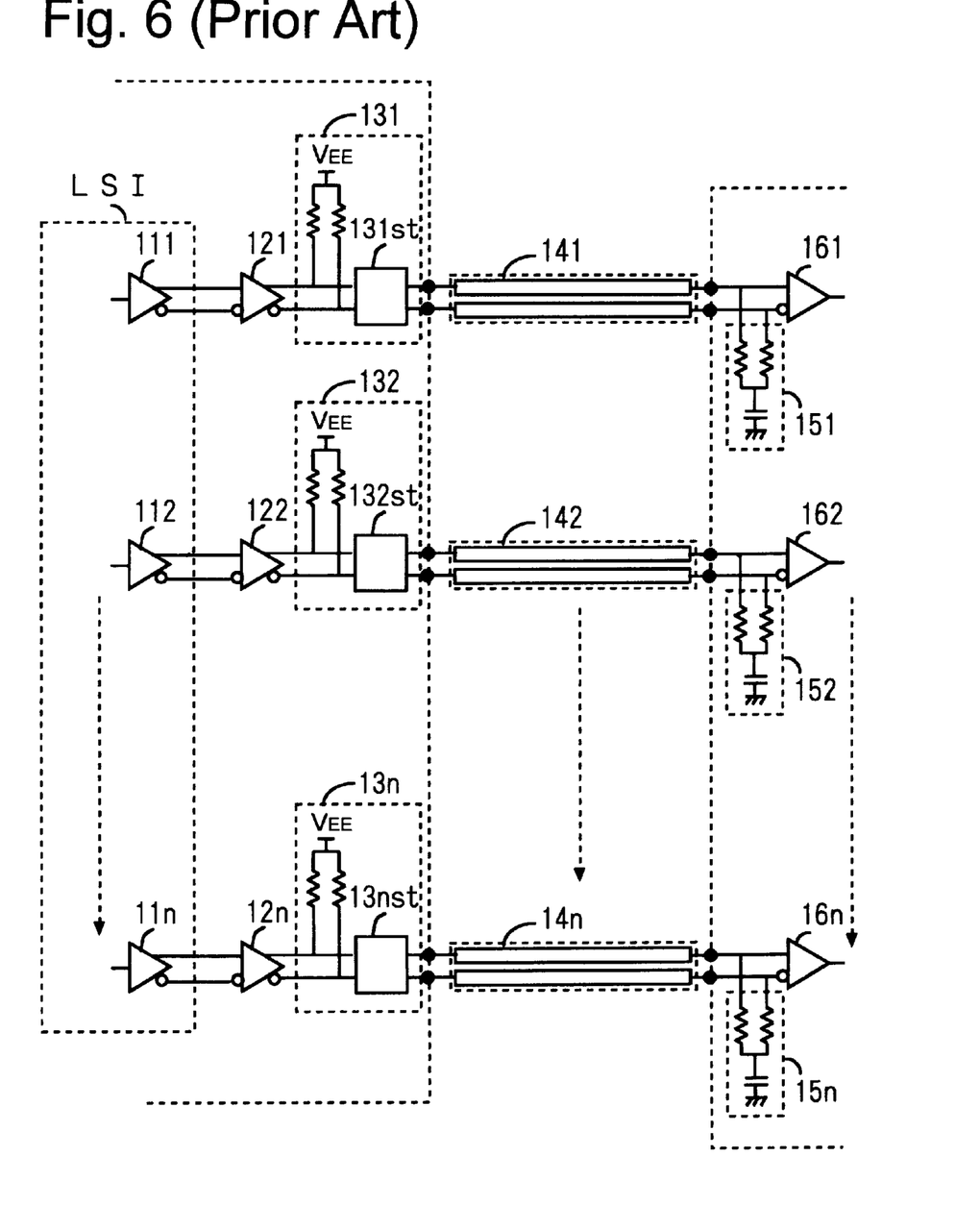
FIG. 6 is a block diagram showing an example of structure in the differential signal transmission circuit in the conventional technology.
Figure 7A:
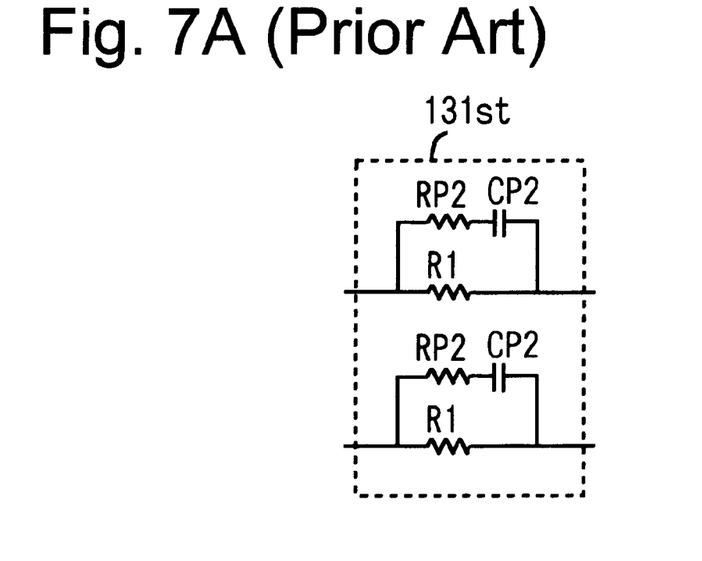
FIGS. 7A and 7B are circuit diagrams showing examples of circuit structure in the series termination circuits in the differential signal transmission circuit of the present invention.
Figure 7B:
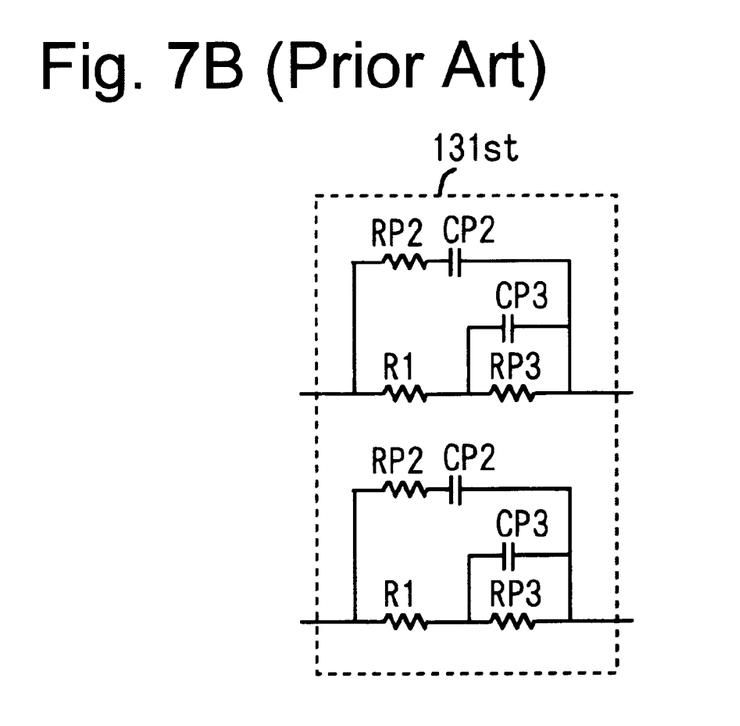

An example of circuit arrangement in a differential signal transmission circuit is shown in FIGS. 5, 6 and 7 for transmitting high speed pulse signals. An example of FIG. 6 has n channels of transmission circuits. In this example, the differential signal transmission circuit is configured with output buffers $11_1$–$11_n$, ECL (Emitter-Coupled Logic) differential drivers $12_1$–$12_n$, sender resistors $13_1$–$13_n$, transmission cables $14_1$–$14_n$, receiver resistors $15_1$–$15_n$, differential receivers $16_1$–$16_n$.

Pulse widths of the high speed pulse signals in such an application of a high speed semiconductor test system are as narrow as several hundred pico-seconds. The pulse waveform reproduced at the output of the differential receiver 16 needs to maintain the high timing resolution in the original pulse signal with respect to the leading edge and trailing edge (rising and falling edges) of the pulse waveform. Further, the reproduced pulse waveform must not have jitters in the rising edge and falling edge thereof.

The output buffer 11 is a CMOS buffer provided at the output stage of an LSI circuit to interface with an ECL level of the ECL differential driver 12. A plurality of output buffers $11_1$–$11_n$ may be provided at the output of the LSI circuit to receive high speed pulse signals from he LSI circuit and convert the logic levels of the pulse signals to an ECL level to be received by the ECL differential drivers $12_{1-12n}$. Examples of the output buffers are, PECL (Positive Emitter Coupled Logic), PCML (Pseudo Current Mode Logic) and LVDS (Low Voltage Differential Signal), all of which are CMOS drivers but with ECL voltage swings.

The transmission cables $14_1$–$14_n$ are, for example, differential coaxial cables for propagating high frequency signals therethrough. A typical characteristic impedance of the coaxial cable is 110 ohms. In the application of a semiconductor test system, the transmission cables $14_1$–$14_n$ connect between the main frame and test stations of the semiconductor test system. In such an application, the length of the transmission cables is 5 meters or more.

The ECL drivers $12_1$–$12_n$ are differential type drivers which receive the high speed pulse signals from the output buffers $11_1$–$11_n$ to drive the transmission cables $14_1$–$14_n$. The output impedance $Z_{out}$ of the ECL drivers 12 is several ohms which is substantially lower than the characteristic impedance of the transmission cables 14. Each of the sender resistors $13_1$–$13_n$ includes pull down resistors of several hundred ohms connected to a voltage source $V_{EE}$ as shown in FIG. 6. The sender resistor 13 further includes a series termination circuit $13_{ST}$ each of which having a pair of series resistor $R_1$ and a peaking circuit. Each of the peaking circuits is formed of a resistor $RP_2$ and a capacitor $CP_2$ as shown in FIG. 7.

The series resistor $R_1$ in the series termination circuit $13_{1ST}$ has an impedance of around 50 ohms so that the sum of the impedance $R_1$ and the $Z_{out}$ of the ECL differential driver 12 is equal to a half of the characteristic impedance (110 ohm) of the transmission cable 14. This impedance arrangement can effectively terminate and thus absorb a reflected signal from the differential receiver 16 by the sum of the series resistors $R_1$ and the output impedance $Z_{out}$ of the ECL differential buffer 14.

As known in the art, the peaking circuit is used in a high speed pulse transmission circuit to compensate or enhance high frequency components in the pulse signal to maintain the sharpness of the rising and falling edges of the pulse signal. The example of FIG. 7A is a first order peaking circuit having the peaking resistor $RP_2$ and the peaking capacitor $CP_2$ connected in series. FIG. 7B shows another example of peaking circuit which is formed of a first order peaking circuit having a peaking resistor $RP_2$ and a peaking capacitor $CP_2$ connected in series as well as a second order peaking circuit having a peaking resistor $PR_3$ and a peaking capacitor $PC_3$ connected in parallel.

Each of the receiver resistors $15_1$–$15_n$ is a pair of parallel resistors for terminating the transmission cable 14 at the input of the differential receiver 16. The impedance of each of the parallel resistors is, for example, around 55 ohms. The parallel resistors are connected to the ground through a capacitor as shown in FIG. 6. In receiving the differential pulse signals, the differential receivers $16_1$–$16_n$ reproduce the transmitted pulse signals at their outputs.

In the conventional differential signal transmission circuit as described above, the ECL differential drivers 12 drive the transmission cables 14 to send the pulse signals. The reason for requiring the ECL differential drivers 12 in this arrangement is that the output buffers 11 in the LSI circuit do not have output impedance small enough to mach the characteristic impedance of the transmission cables 14.

Typically, a semiconductor test system has high speed pulse signal transmission channels of several hundreds or more. Thus, in such an application of the semiconductor test system, a large number of ECL differential drivers must be mounted on a printed circuit board at the output of the LSI circuit as shown in FIG. 5. Since the conventional technology requires a large number of ECL drivers, it is disadvantages because it involves the increase of power consumption, increase in the space in the printed circuit board, and the increase in the cost.

SUMMARY OF THE INVENTION

Therefore, it is an object of the present invention to provide a differential signal transmission circuit in which CMOS (Complementary Metal Oxide Semiconductor) driver circuits having relatively high output impedance provided at the output of the LSI circuit directly drive the transmission cables.

It is another object of the present invention to provide a differential signal transmission circuit in which CMOS driver circuits which directly drive the transmission cables are integrated in an LSI circuit.

It is a further object of the present invention to provide a differential signal transmission circuit which can obviate the use of ECL differential drivers in driving the transmission cables for transmitting high speed pulse signals.

It is a further object of the present invention to provide a differential signal transmission circuit which is capable of decreasing the power consumption, the space in the printed circuit board, and the production cost.

In the differential signal transmission circuit of the present invention, CMOS (Complementary Metal Oxide Semiconductor) drivers directly drive differential transmission cables for transmitting high speed signals therethrough. The differential signal transmission circuit is comprised of a CMOS differential driver for receiving a high speed signal to be transmitted from an LSI circuit and providing the signal to a differential transmission cable, an impedance matching circuit provided at an output of the CMOS differential driver to decrease an output impedance of the driver, and a series termination circuit provided between the output of the CMOS differential driver and the differential transmission cable to match an overall impedance at the output of the driver with a characteristic impedance of the differential transmission cable.

The differential signal transmission circuit of the present invention obviates the need of the ECL drivers in the conventional technology. The differential signal transmission circuit includes a plurality of transmission channels for transmitting high speed pulse signals generated by the LSI circuit. The CMOS driver in each transmission channel is integrated into the LSI circuit which is a CMOS integrated circuit.

The differential signal transmission circuit noted above further includes a differential receiver provided at an end of the differential transmission cable for receiving and reproducing the high speed signal through the transmission cable, and a receiver resistor connected at an input of the differential receiver to match an input impedance of the differential receiver with the characteristic impedance of the transmission cable.

According to the present invention, the differential signal transmission circuit includes CMOS differential drivers which have relatively high output impedance provided at the output of the LSI circuit and directly drive the transmission cables. The CMOS driver circuits in the transmission circuit can be integrated into an LSI circuit at the output stage thereof. The differential signal transmission circuit of the present invention does not require the conventional ECL differential drivers for driving the transmission cables. Thus, the differential signal transmission circuit of the present invention is capable of decreasing the power consumption, the space in the printed circuit board, and the production cost.

DETAILED DESCRIPTION OF THE PREFERRED EMBODIMENT

Figure 1:
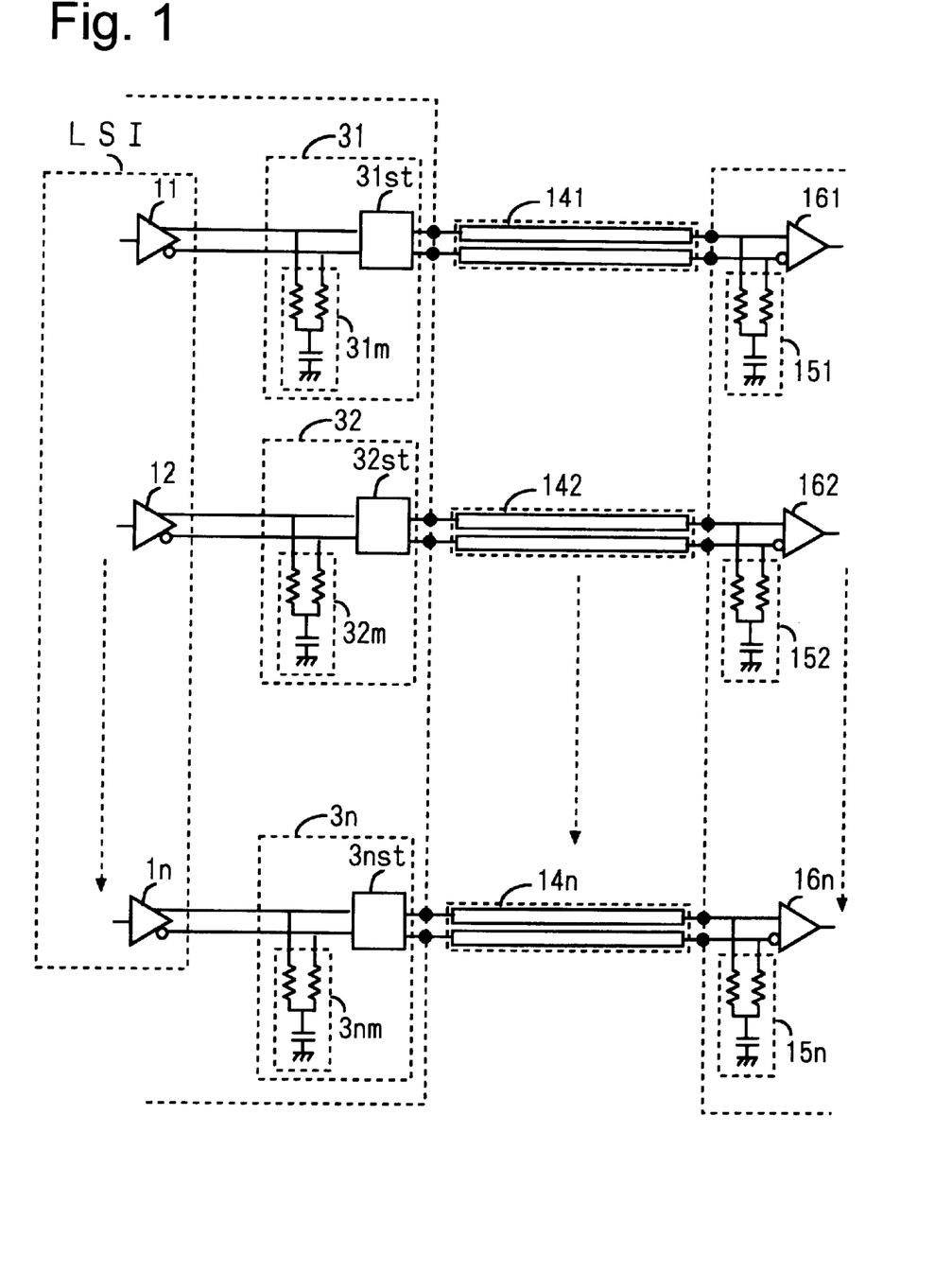
FIG. 1 is a block diagram showing an example of structure in the differential signal transmission circuit of the present invention.

FIG. 1 shows an example of circuit structure of the differential signal transmission circuit of the present invention. In the present invention, the differential signal transmission circuit is configured with CMOS (Complementary Metal Oxide Semiconductor) differential drivers $1_1$–$1_n$, impedance matching circuits $3_1$–$3_n$, transmission cables $14_1$–$14_n$, receiver resistors $15_1$–$15_n$, differential receivers $16_1$–$16_n$. Each of the impedance matching circuits 3 is formed of a pair of parallel resistors $3_m$ and a series termination circuit $3_{st}$.

The CMOS differential drivers $1_1$–$1_n$ provide pulse signals directly to the transmission cables 14. The parallel resistors $3_{1m}$–$3_{nm}$ in the impedance matching circuit 3 provided at the output of the CMOS differential drivers 1 are to decrease the output impedance of the CMOS differential drivers 1. The series termination circuits $3_{1st}$–$3_{nst}$ are provided in the impedance matching circuit 3 to match the overall impedance at the output of the CMOS differential drivers 1 with the characteristic impedance of the transmission cables 14.

Figure 4:
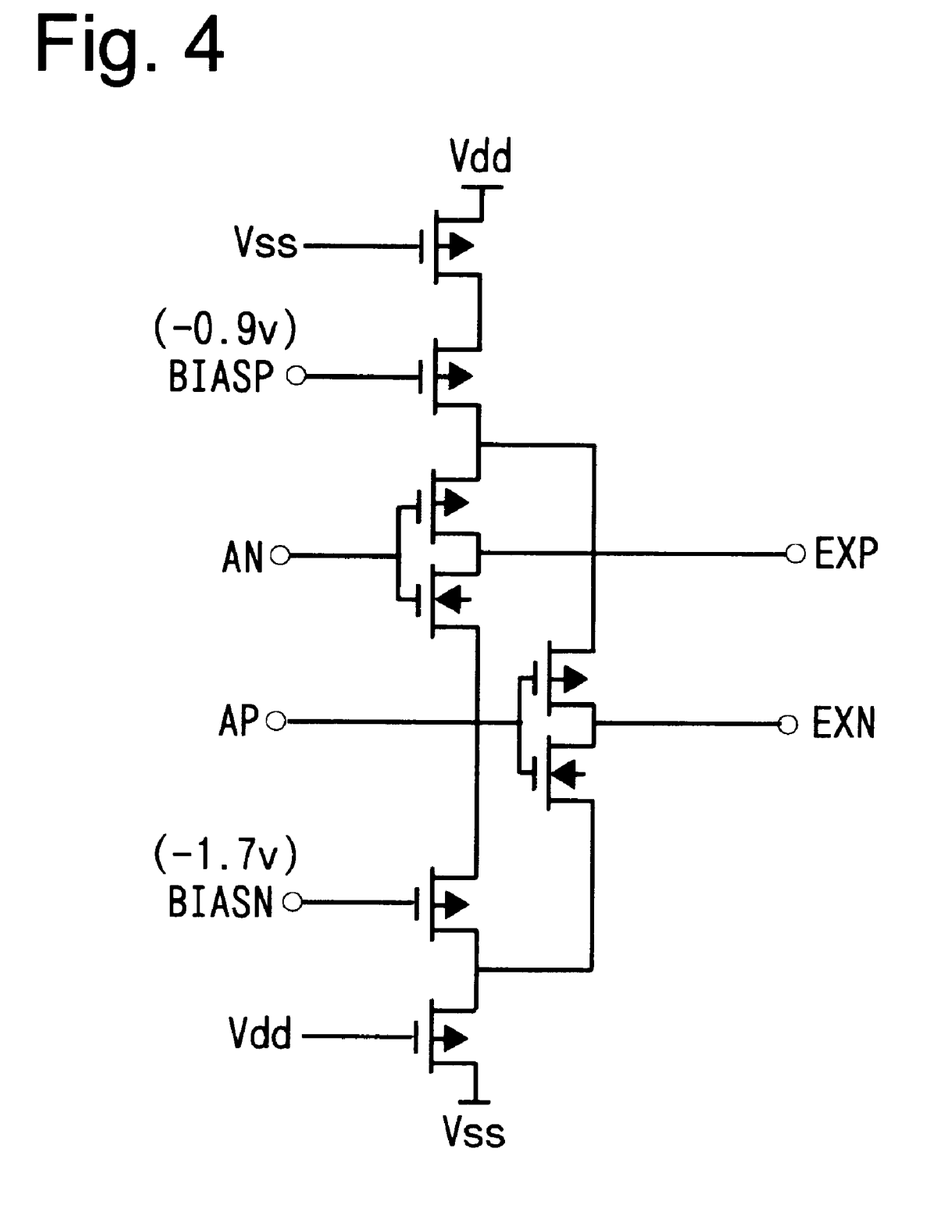
FIG. 4 is a circuit diagram showing an example of circuit structure in the differential driver of an LVDS type to be used in the differential signal transmission circuit of the present invention.

The differential drivers $1_1$–$1_n$ are CMOS circuits provided at the output stage of the LSI circuit. Preferably, the CMOS drivers $1_1$–$1_n$ are integrated into the LSI circuit. An example of such a CMOS differential driver is an LVDS (Low Voltage Differential signal) driver, a circuit diagram of which is shown in FIG. 4. Since the LVDS driver in FIG. 4 is a CMOS circuit, the output impedance thereof is relatively high such as 150 ohms which will not match the termination resistors $R_1$ or the characteristic impedance of the transmission cable 14.

To transmit the high speed pulse signal without losing its signal quality such as rise and fall times in the edges, impedance matching is established by the impedance matching circuits $3_1$–$3_n$. As noted above, each of the impedance matching circuits 3 is formed of a pair of parallel resistors $3_m$ and a series termination circuit $3_{st}$. The series termination circuits $3_{1st}$–$3_{nst}$ may have the same circuit structure as shown in FIGS. 7A and 7B and are configured with a series termination resistor and one or more peaking circuits. As described with reference to FIG. 6, the series termination circuits $3_{1st}$–$3_{nst}$ establish impedance matching with the transmission cables 14 as well as compensating the overall high frequency response of the differential signal transmission circuit.

The purpose of the parallel resistors $3_{1m}$–$3_{nm}$ in the impedance matching circuits 3 is to adjust the output impedance of the CMOS differential drivers 1. In the high frequency domain, two parallel resistors $3_{1m}$–$3_{nm}$ terminate the output of the CMOS differential drivers 1 to the ground. Thus, the equivalent impedance at the output of the CMOS differential driver is decreased to a value dependant upon the amount of impedance value of the parallel resistors $3_{1m}$–$3_{nm}$. The purpose of the capacitor inserted between the parallel resistors and the ground is to remove common mode noise and is not essential to the transmission of the high speed pulse signals.

Figure 2:
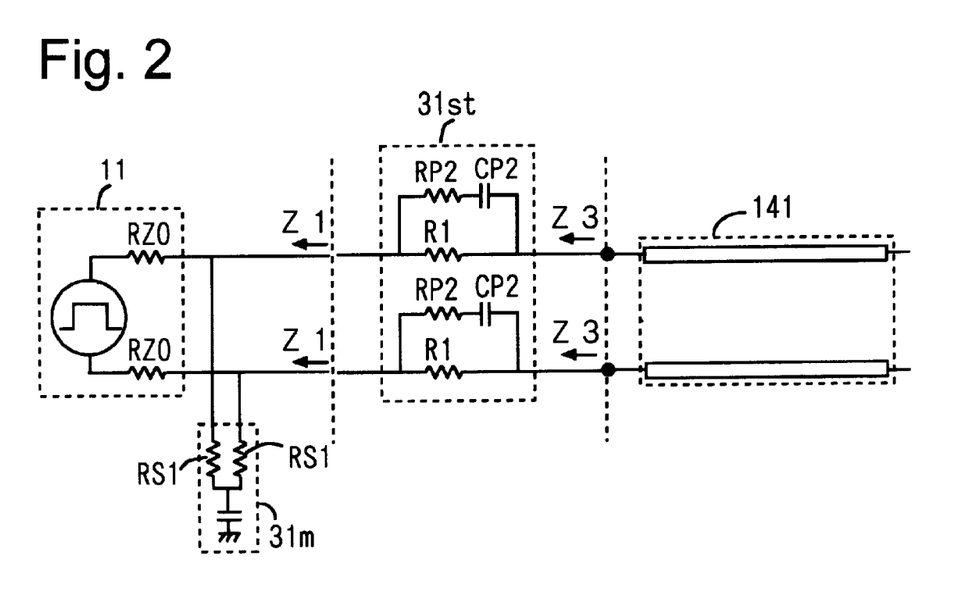
FIG. 2 is a schematic diagram showing an impedance relationship in the differential signal transmission circuit of the present invention.

FIG. 2 is a schematic diagram showing an impedance relationship in a single (first) channel of the differential signal transmission circuit of FIG. 1. Since the characteristic impedance of the transmission cable $14_1$ is 110 ohms, the impedance $Z_3$ in FIG. 2 must be a half of the characteristic impedance, i.e., 55 ohms. The impedance of the series resistor $R_1$ in the series termination circuit $3_{1st}$ must not be too small, otherwise the effect of the peaking circuit in the high frequency region will be decreased. Thus, the impedance of the series resistor $R_1$ is, for example, 33 ohms. Consequently, the impedance $Z_1$ in FIG. 2 is 22 ohms which is the difference between the $Z_3$ (55 ohms) and the resistor $R_1$ (33 ohms).

The output impedance of the CMOS differential driver $1_1$ and the impedance matching circuit $3_{1m}$ are connected in parallel with one another. Thus, the overall impedance of the parallel connection must match the impedance $Z_1$ which is 22 ohms in the above example. Since the output impedance of the CMOS differential driver $1_1$ is 150 ohms, the impedance of the parallel resistor $R_{s1}$ in the impedance matching circuit $3_{1m}$ is calculated to be about 25.8 ohms. Allowable variation in the impedance amount of the parallel resistor $R_{s1}$ are dependent on the desired timing resolution and jitter tolerance in the reproduced pulse signal at the output of the differential receiver 16. In the practical use, the impedance variation of ±10% of the characteristic impedance of the transmission cable 14 is acceptable for the parallel resistor $R_{s1}$.

In the foregoing example, because of the parallel resistors $R_{s1}$ in the impedance matching circuit, an amplitude of the pulse signal at the output of the CMOS differential driver $1_1$ will be attenuated before being supplied to the transmission cable 14. Such a reduction of the amplitude do not cause any problems in the practical application, since the receiver 16 has a high input sensitivity because of the differential structure.

By the circuit arrangement in the foregoing, the impedance match is achieved between the characteristic impedance of the transmission cable 14 and an overall terminal impedance formed of the series termination circuit $3_{1s}$, impedance matching circuit $3_{1m}$ and the CMOS differential driver $1_1$. The high frequency compensation by the peaking circuit is also achieved in the manner similar to the conventional example. Therefore, the high speed pulse signal can be effectively transmitted through the differential signal transmission circuit without using the conventional ECL drivers of FIGS. 5 and 6.

Figure 3:
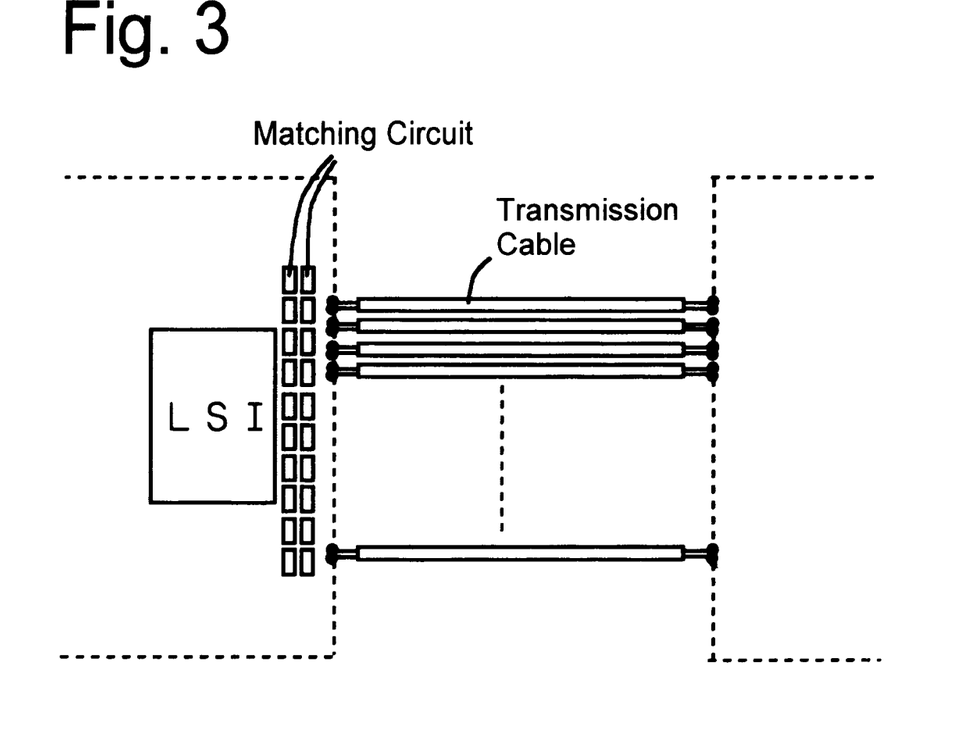
FIG. 3 is a schematic diagram showing a physical layout in the differential signal transmission circuit of the present invention.

In the present invention, the CMOS differential drivers 1 can directly supply the pulse signal to the transmission cables without using the ECL differential drivers. The CMOS differential drivers can be integrated in the CMOS LSI circuit at the last stage thereof. Thus, a physical layout in the differential signal transmission circuit of the present invention is considerably simplified as shown in FIG. 3. Accordingly, the transmission circuit of the present invention is advantageous over the prior art in its higher circuit density, lower power consumption, and lower production cost.

The CMOS differential drivers in the foregoing example are LVDS drivers. Other types of differential drivers are also feasible in the present invention such as pseudo ECL devices including PECL (Positive Emitter Coupled Logic) and PCML (Pseudo Current Mode Logic). Further, the CMOS differential drivers can be arranged separately from the LSI circuit. Other relatively high output impedance circuit, such as a differential driver formed with a TTL IC can also be feasible in the present invention with associated impedance matching circuits.

Although, the transmission cables 14 are coaxial cables in the foregoing example, other types of transmission cables are also feasible in the present invention. For example, twisted pair cables, strip lines on a printed circuit board, and coaxial cables of other impedance can be used. Further, in the foregoing example, a pair of transmission cables are used in a channel of transmission circuit. However, a single line of transmission cable is also feasible in the present invention.

According to the present invention, the differential signal transmission circuit includes CMOS differential drivers which have relatively high output impedance provided at the output of the LSI circuit and directly drive the transmission cables. The CMOS driver circuits in the transmission circuit can be integrated into an LSI circuit at the output stage thereof. The differential signal transmission circuit of the present invention does not require the conventional ECL differential drivers for driving the transmission cables. Thus, the differential signal transmission circuit of the present invention is capable of decreasing the power consumption, the space in the printed circuit board, and the production cost.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A differential signal transmission circuit for transmitting a high speed signal through a differential transmission line, comprising:

a CMOS (Complementary Metal Oxide Semiconductor) differential driver for receiving a high speed signal to be transmitted from an LSI circuit and providing the signal to a differential transmission cable;

an impedance matching circuit connected between an output of the CMOS differential driver and ground to substantially decrease an output impedance of the CMOS differential driver; and a series termination circuit provided between the output of the CMOS differential driver and the differential transmission cable to match a sum of resistance of the series transmission circuit and an overall impedance at the output of the CMOS differential driver with a characteristic impedance of the differential transmission cable.

2. A differential signal transmission circuit as defined in claim 1, wherein the CMOS differential driver is integrated into the LSI circuit at an output stage of the LSI circuit which is a CMOS integrated circuit.

3. A differential signal transmission circuit as defined in claim 1, further comprising a differential receiver provided at an end of the differential transmission cable opposite to the CMOS differential driver for receiving and reproducing the high speed signal through the differential transmission cable, and a receiver resistor connected at an input of the differential receiver to match an input impedance of the differential receiver with the characteristic impedance of the differential transmission cable.

4. differential signal transmission circuit as defined in claim 1, wherein the series termination circuit includes a termination resistor provided in series with the differential transmission cable, and a peaking circuit for compensating a high frequency signal transmission characteristics of the differential signal transmission circuit.

5. A differential signal transmission circuit as defined in claim 4, wherein the series resistor and the peaking circuit are connected in parallel with each other, and the peaking circuit is formed of a resistor and a capacitor series connected with each other.

6. A differential signal transmission circuit as defined in claim 4, wherein the high speed signal is a pulse signal whose delays in transition times of leading and trailing edges are compensated by the peaking circuit.

7. A differential signal transmission circuit for transmitting a high speed signal through a differential transmission line, comprising:

a plurality of transmission channels for transmitting high speed pulse signals generated by an LSI circuit, each of the transmission channel is comprised of:

a CMOS (Complementary Metal Oxide Semiconductor) differential driver for receiving a high speed signal to be transmitted from the LSI circuit and providing the high speed signal to a differential transmission cable;

an impedance matching circuit connected between an output of the CMOS differential driver and ground to substantially decrease an output impedance of the CMOS differential driver;

a series termination circuit provided between the output of the CMOS differential driver and the differential transmission cable to match a sum of resistance of the series transmission circuit and an overall impedance at the output of the driver with a characteristic impedance of the differential transmission cable; and a differential receiver provided at an end of the differential transmission cable for receiving and reproducing the high speed signal through the differential transmission cable;

wherein the CMOS differential driver in each transmission channel is integrated into the LSI circuit, and wherein the LSI circuit is a CMOS integrated circuit.

8. A differential signal transmission circuit as defined in claim 7, wherein each of the transmission channel is further comprised of a receiver resistor connected at an input of the differential receiver to match an input impedance of the differential receiver with the characteristic impedance of the differential transmission cable.

9. A differential signal transmission circuit as defined in claim 7, wherein the series termination circuit in each of the transmission channel includes a termination resistor provided in series with the differential transmission cable, and a peaking circuit for compensating a high frequency signal transmission characteristics of the differential signal transmission circuit.

10. A differential signal transmission circuit as defined in claim 9, wherein the series resistor and the peaking circuit are connected in parallel with each other, and the peaking circuit is formed of a resistor and a capacitor series connected with each other.

11. A differential signal transmission circuit as defined in claim 9, wherein delays in transition times of leading and trailing edges of the high speed pulse signal are compensated by the peaking circuit.

* * * * *